United States Patent [19]

Hill et al.

[11] 4,196,397
[45] Apr. 1, 1980

[54] SYNCHRO POWER BUFFER AMPLIFIER

[75] Inventors: Emile R. Hill, Wayne; Louis P. De Leo, Totowa Boro, both of N.J.

[73] Assignee: The Singer Company, Little Falls, N.J.

[21] Appl. No.: 950,919

[22] Filed: Oct. 12, 1978

[51] Int. Cl.² .......................... H03F 1/34; H03F 3/68
[52] U.S. Cl. ................................ 330/84; 330/124 R; 330/166; 330/196
[58] Field of Search ............... 318/691; 330/84, 165, 330/166, 188, 195, 124 R, 196

[56] References Cited
U.S. PATENT DOCUMENTS 3,678,593  7/1972  Baker et al. ............... 318/691 U X

*Primary Examiner*—James B. Mullins
*Attorney, Agent, or Firm*—T. W. Kennedy

[57] ABSTRACT

A synchro buffer amplifier is provided which uses two matched amplifiers respectively connected to the primary windings of two transformers. Two input leads are respectively connected to the inputs of the two amplifiers and a third input lead is grounded. The secondary windings of the two transformers are connected in series, and three output leads are respectively connected to the other sides of the two secondary windings and to the common secondary connection. Direct feedback is provided for each amplifier. Any circuit unbalance is compensated by the insertion of a low value choke in the common transformer secondary connection. Three capacitors are connected across the respective output leads partially to tune the loads, and thereby to nullify to some extent the effects of heavy inductive loads so as to allow operation of the buffer amplifier over a wider range of loads than would otherwise be possible.

5 Claims, 3 Drawing Figures

SYNCHRO POWER BUFFER AMPLIFIER

BACKGROUND

The term synchro is a generic term which covers a variety of alternating current electromechanical devices used in data transmission and computing systems. A synchro provides mechanical indication of its shaft position as the result of an electrical input, or an electrical output which represents some function of the angular displacement of its shaft. The aforesaid electromechanical devices are basically variable transformers, each having a rotor forming a primary winding, and three secondary windings. As the rotor of a synchro rotates it causes a change in the synchro voltage output across the secondary windings.

The major classes of synchros include torque synchros, control synchros, resolvers, and linear synchro transmitters. Although each class of synchro is used in different applications, their construction and the physical laws governing their performance are similar.

In a synchro receiver, the input is an alternating current voltage and the output is mechanical rotation or torque. For the synchro transmitter, the input is mechanical shaft rotation, and the output is expressed as an alternating current voltage. When static, or at slow shaft speeds, synchros are essentially transformers with variable coupling coefficients.

Specifically, "synchro" is the name applied to a wide variety of rotary transducers which are actually alternating current motors or generators. The synchro usually comprises a synchro generator, or transmitter, and a synchro control transformer, or receiver. The synchro transmitter serves as a variable transformer in the measurement of angular position, and comprises basically a transformer with a rotor forming one primary winding and with a Y-connected stator forming three secondary windings.

In construction, the synchro transmitter is similar to a three-phase synchronous generator. However, instead of exciting the rotor field with direct current, and causing the rotor to turn at constant velocity, as in an alternator; the rotor field of the synchro transmitter is excited with a constant single phase alternating current voltage, and the rotor is turned at low speeds. The voltages induced in the secondary windings of the synchro transmitter are proportional to the cosines of the angles between each stator coil and the rotor. In this way, an electrical reference source is formed which may be received at a remote point by the synchro receiver. The synchro receiver operates in a reverse manner to the synchro transmitter, and its rotor is driven to turn in synchronism with the turning of the rotor of the transmitter.

It is usual in practice to include some form of buffer amplifier between the synchro transmitter and the synchro receiver, especially in the case of excessive loading by the receiver. Moreover, in cases when the synchro transmitter is simulated by a computer, a buffer amplifier is required to avoid excessive loading on the computer. Also, the buffer amplifier is needed to isolate the transmitter from the receiver, since the synchro receiver has a tendency to force power back into the transmitter, which creates errors.

The prior art buffer amplifier usually comprises three matched power amplifiers with three output transformers having their secondary windings connected to generate an isolated, balanced three-lead type synchro output. Because of the excessive weight of the three transformers, especially in the cases where the synchro system is to be airborne, attempts have been made in the prior art to simplify the buffer amplifier by using two matched amplifier/transformer circuits connected in an open delta configuration. However, the second prior art system requires additional transformer windings to provide feedback around the transformers in order to reduce the inherent output impedance unbalance.

A disadvantage inherent in the first prior art system is in the number of matched circuitry and transformers required for its implementation. A disadvantage in the second prior art system is in its inherent output impedance unbalance, and its need for additional transformer feedback windings to compensate for such unbalance. Specifically, although the transformer feedback in the second prior art system does serve to reduce the effects of impedance unbalance and non-linear distortion in the primary winding of the transformers, it does not reduce any such effects in the secondary windings. Moreover, the use of transformer feedback in the second prior art system has an adverse effect on the frequency stability of the amplifiers since the frequence response of the transformers is introduced into the feedback loop. The latter factor is particularly troublesome in amplifiers having varying loads of a complex impedance form; such as, the capacitive reactance of cabling on a lightly loaded amplifier changing to the inductive impedance when loaded with multiple synchro loads.

The system of the present invention overcomes the disadvantages inherent in the two prior art systems discussed briefly above and, in addition, provides superior accuracy in performance as compared with such prior art systems. The present invention provides a synchro buffer amplifier which is simple and inexpensive as compared with the prior art synchro buffer amplifiers discussed above, and which is capable of accurate operation in the presence of a wide range of multiple synchro loads of, for example, 0–80 volts/amperes. The buffer amplifier of the invention also has a feature of exhibiting relatively high stability against self-induced oscillation.

DETAILED DESCRIPTION OF THE ILLUSTRATED EMBODIMENT

Figure 1:
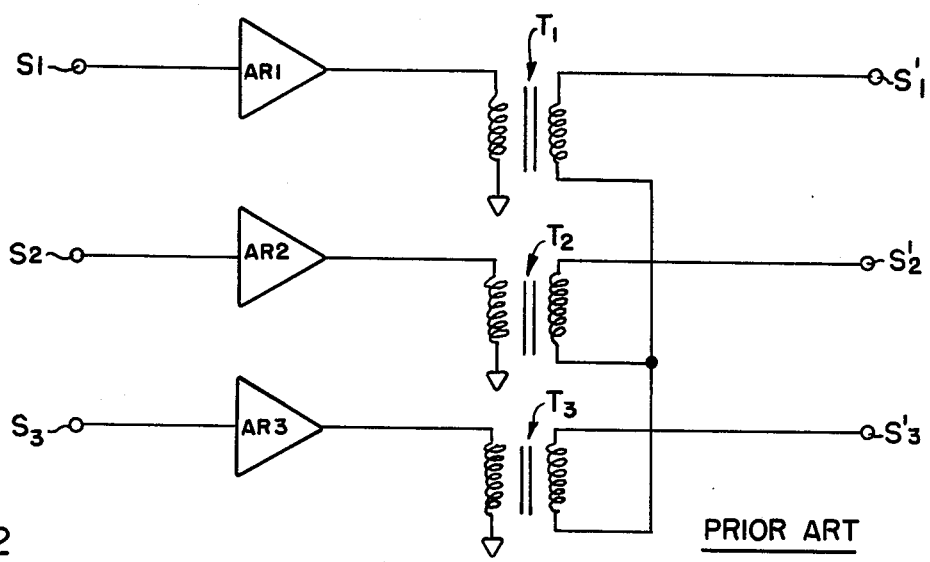
FIG. 1 is a circuit representing the first prior art synchro buffer amplifier discussed above.

The prior art buffer amplifier of FIG. 1 includes three matched amplifiers AR1, AR2 and AR3, and the three input leads S1, S2 and S3 are respectively connected to the inputs of the amplifiers. The outputs of the three amplifiers are introduced respectively to one side of the primary windings of three transformers T1, T2 and T3. In each instance, the other side of the primary winding is grounded. The secondary windings of the three transformers are connected in series, and the other side of each secondary winding is connected to output leads S1', S2' and S3'. As described above, although the buffer amplifier of FIG. 1 does operate satisfactorily to perform its intended purpose, it requires excessive circuitry and structure.

Figure 2:
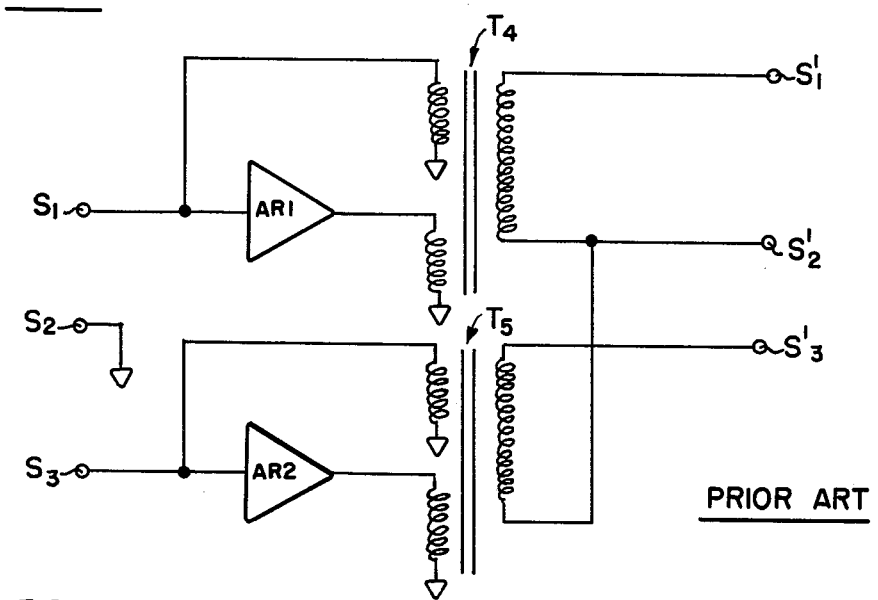
FIG. 2 is a circuit of the second prior art synchro buffer amplifier discussed above.

Accordingly, the prior art buffer amplifier of FIG. 2 was devised, which uses two transformers T4 and T5, rather than the three transformers of the other prior art buffer amplifier of FIG. 1. The buffer amplifier of FIG. 2 uses but two amplifiers A1 and A2, with the input leads S1 and S3 being connected respectively to the two amplifiers, and with the input lead S2 being connected to a point of reference potential. The transformers T4 and T5 are provided with tertiary windings which supply feedback to the inputs of the two amplifiers AR1 and AR2. The secondary windings of the transformers T4 and T5 are connected in series, and to the output leads S1', S2' and S3', as shown.

The prior art circuit of FIG. 2 has certain advantages over the circuit of FIG. 1, in that it requires but two transformers, resulting in savings in cost and weight. However, the circuit of FIG. 2 possesses inherent disadvantages such as discussed above.

Figure 3:
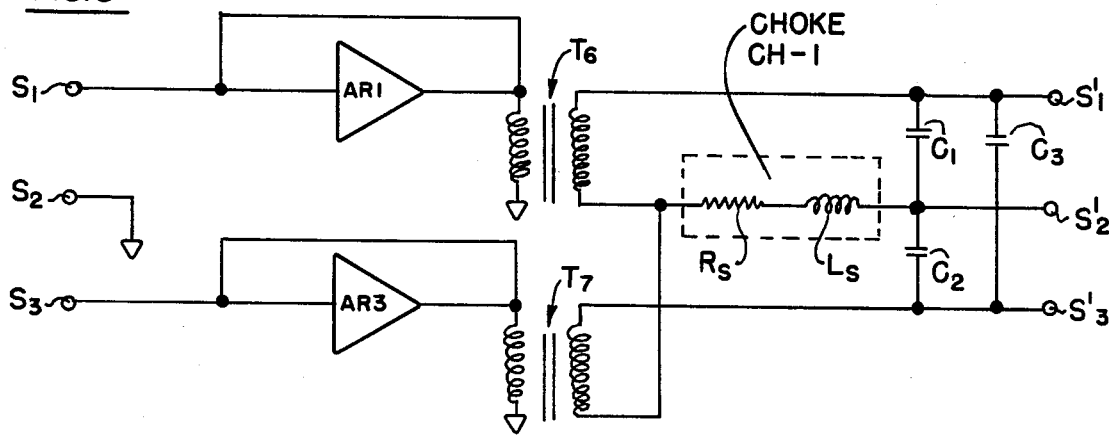
FIG. 3 is a circuit diagram of a synchro buffer amplifier representing one embodiment of the invention, both the amplifiers of FIGS. 2 and 3 operating as push-pull class B amplifiers.

The circuit of the invention, as shown in FIG. 3, is similar in some respects to the circuit of FIG. 2, except that the feedback connections to the two amplifiers are taken directly from their respective outputs, and the tertiary transformer windings are eliminated.

A choke CH-1 is included in the common connection in the circuit of FIG. 3, and three capacitors C1, C2 and C3 are connected across the various output leads S1', S2' and S3'. The purpose of the choke CH-1 in the common transformer secondary connection in the circuit of FIG. 3 is to obviate the problems of circuit unbalance. That is, the purpose of the choke CH-1 is to perform the functions performed by the tertiary windings in the circuit of FIG. 2. The choke has an alternating current resistance ($R_S$) and an inductance ($L_S$) equal to that of the transformers secondary windings when measured with the primary windings short circuited. The three capacitors C1, C2 and C3, as briefly noted above, partially tune the load and serve partially to nullify the effects of heavy inductive loading so as to permit operation of the system over a wide range of loads.

The buffer of the invention, as exemplified in the circuit diagram of FIG. 3, and as stated above, overcomes the disadvantages of the prior art systems of FIGS. 1 and 2, while providing superior accuracy in performance, as compared with the prior art systems. In the buffer amplifier of FIG. 3, the two-amplifier transformer approach of the prior art amplifier of FIG. 2 is used because of the economy in circuitry and components. However, as stated above, the transformer feedback tertiary windings in the amplifier of FIG. 2 are eliminated in the system of FIG. 3 as a further simplification, and instead, direct feedback from the transformer primary windings is used.

The direct feedback in the buffer amplifier of FIG. 3 more effectively reduces the cross-over distortion introduced by the push-pull class B output stage than the transformer feedback in the system of FIG. 2 is able to accomplish. Moreover, the direct feedback of the buffer amplifier of FIG. 3 minimizes the possibility of the production of direct current unbalanced currents in the primary windings of the transformers as compared with the system of FIG. 2. This latter feature of the buffer of FIG. 3, in turn obviates any non-linear distortion which could have been caused by the direct current unbalanced currents. In addition, the elimination of the transformer feedback tertiary windings in the buffer of FIG. 3 simplifies the problems of stabilizing the frequency response characteristics of the buffer.

By utilizing the buffer of FIG. 3, synchro errors of under two minutes of arc have been realized in a constructed embodiment of the invention with varying external loads of from 0–80 volts/amperes. The prior art system of FIG. 2, on the other hand, displays errors varying from 5–10 minutes of arc under the same load conditions.

The invention provides, therefore, an improved, simplified and inexpensive buffer amplifier for use in a synchro system, which amplifier operates accurately in the presence of multiple synchro loads of a wide range, and which amplifier is stable in its operation.

It will be appreciated that while a particular embodiment of the invention has been shown and described, modifications may be made. It is intended in the claims to cover the modifications which come within the spirit and scope of the invention.

What is claimed is:

1. A synchro buffer amplifier comprising:
   first and second input leads;
   first and second amplifiers having respective inputs connected to said first and second input leads and having respective outputs;
   first and second transformers each having a primary winding and a secondary winding, one side of the primary windings being respectively connected to the outputs of the respective amplifiers;
   first and second feedback connections extending from said one side of the respective primary windings to the respective inputs of the first and second amplifiers;
   first and second output leads respectively connected to one side of the secondary windings of the first and second transformers;
   a third output terminal;
   a common connection means including impedance means connecting said third output terminal to the other side of both of the secondary windings; and
   a third input lead connected to a point of reference potential, and in which the other side of the primary winding of each of the first and second transformers is connected to said point of reference potential.

2. The synchro buffer amplifier defined in claim 1, and in which said impedance means comprises choke means.

3. The synchro buffer amplifier defined in claim 2, in which said choke means has an alternating current resistance and an inductance equal to that of the transformer secondary windings when measured with the primary windings short circuited.

4. The synchro buffer amplifier defined in claim 3, and which includes three separate capacitor means connected across each pair of said three output leads.

5. The synchro buffer amplifier defined in claim 1, and which includes three separate capacitor means connected across each pair of the three output leads.

* * * * *